US011222979B2

(12) United States Patent
Miao et al.

(10) Patent No.: US 11,222,979 B2
(45) Date of Patent: Jan. 11, 2022

(54) FIELD-EFFECT TRANSISTOR DEVICES WITH SIDEWALL IMPLANT UNDER BOTTOM DIELECTRIC ISOLATION

(71) Applicant: International Business Machines Corporation, Armonk, NY (US)

(72) Inventors: Xin Miao, Slingerlands, NY (US); Alexander Reznicek, Troy, NY (US); Jingyun Zhang, Albany, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 16/855,472

(22) Filed: Apr. 22, 2020

(65) Prior Publication Data

US 2021/0336056 A1    Oct. 28, 2021

(51) Int. Cl.
| | | |
|---|---|---|
| *H01L 29/78* | (2006.01) | |
| *H01L 21/02* | (2006.01) | |
| *H01L 29/06* | (2006.01) | |
| *H01L 29/66* | (2006.01) | |
| *H01L 21/762* | (2006.01) | |
| *H01L 29/165* | (2006.01) | |

(52) U.S. Cl.
CPC ........ *H01L 29/7848* (2013.01); *H01L 21/022* (2013.01); *H01L 21/0217* (2013.01); *H01L 21/02164* (2013.01); *H01L 21/02186* (2013.01); *H01L 21/76229* (2013.01); *H01L 29/0649* (2013.01); *H01L 29/165* (2013.01); *H01L 29/66553* (2013.01); *H01L 29/66803* (2013.01)

(58) Field of Classification Search
None
See application file for complete search history.

(56) References Cited

U.S. PATENT DOCUMENTS

| | | |
|---|---|---|
| 9,917,152 B1 | 3/2018 | Cheng et al. |
| 9,972,701 B2 | 5/2018 | Kim et al. |
| 10,170,638 B1 | 1/2019 | Reznicek |
| 10,242,920 B2 | 3/2019 | Guillorn et al. |
| 10,256,158 B1 | 4/2019 | Frougier et al. |
| 10,256,301 B1 | 4/2019 | Reznicek |
| 10,263,100 B1 | 4/2019 | Bi et al. |
| 2018/0301564 A1 | 10/2018 | Kwon et al. |
| 2018/0308988 A1 | 10/2018 | Chao et al. |

(Continued)

*Primary Examiner* — Asok K Sarkar
(74) *Attorney, Agent, or Firm* — Jeffrey S. LaBaw; Michael J. Chang, LLC

(57) ABSTRACT

FET devices with bottom dielectric isolation and sidewall implants in the source and drain regions to prevent epitaxial growth below the bottom dielectric isolation are provided. In one aspect, a semiconductor FET device includes: a device stack(s) disposed on a substrate, wherein the device stack(s) includes active layers oriented vertically over a bottom dielectric isolation layer; STI regions embedded in the substrate at a base of the device stack(s), wherein a top surface of the STI regions is recessed below a top surface of the substrate exposing substrate sidewalls under the bottom dielectric isolation region, wherein the sidewalls of the substrate include implanted ions; source and drains on opposite sides of the active layers; and gates surrounding a portion of each of the active layers, wherein the gates are offset from the source and drains by inner spacers. A method of forming a semiconductor FET device is also provided.

13 Claims, 19 Drawing Sheets

(56) References Cited

U.S. PATENT DOCUMENTS

| | | |
|---|---|---|
| 2019/0109052 A1 | 4/2019 | Reznicek |
| 2020/0135853 A1* | 4/2020 | Bao .................. H01L 29/66439 |
| 2020/0227305 A1* | 7/2020 | Cheng ............... H01L 29/78696 |
| 2020/0266060 A1* | 8/2020 | Cheng ................ H01L 29/0653 |
| 2021/0226034 A1* | 7/2021 | Xie .................... H01L 29/0649 |

\* cited by examiner

FIELD-EFFECT TRANSISTOR DEVICES WITH SIDEWALL IMPLANT UNDER BOTTOM DIELECTRIC ISOLATION

FIELD OF THE INVENTION

The present invention relates to field effect transistor (FET) devices with bottom dielectric isolation, and more particularly, to FET devices with sidewall implant under the bottom dielectric isolation in the source and drain regions to prevent epitaxial growth below the bottom dielectric isolation.

BACKGROUND OF THE INVENTION

Nanosheets have been identified as the next generation field effect transistor (FET) architecture after finFET. Due to the scaled gate length, nanosheet FET devices need bottom dielectric isolation in order to prevent leakage from the source to drain via the substrate. However, implementing bottom dielectric isolation for nanosheet FET devices presents some notable challenges.

For instance, it is very challenging to grow high-quality source and drain epitaxy without also growing nodules from below the bottom dielectric isolation region. These sub dielectric isolation region nodules can undesirably connect with the source and drain epitaxy above the dielectric isolation region, which defeats the purpose of forming the dielectric isolation region in the first place.

Thus, techniques for avoiding growth of these sub dielectric isolation region parasitic nodules, and which improve the quality of the source and drain epitaxy would be desirable.

SUMMARY OF THE INVENTION

The present invention provides field effect transistor (FET) devices with bottom dielectric isolation and sidewall implants in the source and drain regions to prevent epitaxial growth below the bottom dielectric isolation. In one aspect of the invention, a semiconductor FET device is provided. The semiconductor FET device includes: at least one device stack disposed on a substrate, wherein the at least one device stack includes active layers oriented vertically over a bottom dielectric isolation layer; shallow trench isolation (STI) regions embedded in the substrate at a base of the at least one device stack, wherein a top surface of the STI regions is recessed below a top surface of the substrate exposing sidewalls of the substrate under the bottom dielectric isolation region, wherein the sidewalls of the substrate include implanted ions; source and drains on opposite sides of the active layers; and gates surrounding a portion of each of the active layers, wherein the gates are offset from the source and drains by inner spacers.

In another aspect of the invention, a method of forming a semiconductor FET device is provided. The method includes: forming a device stack on a substrate, wherein the device stack includes a first sacrificial layer deposited on the substrate, and alternating second sacrificial layers and active layers deposited on the first sacrificial layer; forming STI regions in the substrate at a base of the device stack; forming sacrificial gates on the device stack, wherein a top surface of the STI regions is recessed below a top surface of the substrate during formation of the sacrificial gates which exposes sidewalls of the substrate under the first sacrificial layer; removing the first sacrificial layer which forms a cavity in the device stack; forming spacers along sidewalls of the sacrificial gates and a bottom dielectric isolation layer in the cavity; implanting ions into the sidewalls of the substrate under the bottom dielectric isolation layer; patterning trenches in the device stack in between the sacrificial gates; forming source and drains in the trenches on opposite sides of the active layers; surrounding the sacrificial gates in an interlayer dielectric (ILD); removing the sacrificial gates which forms gate trenches in the ILD; removing the second sacrificial layers through the gate trenches to form gaps in the FET stacks in between the active layers; and forming replacement gates in the gate trenches and in the gaps such that the replacement gates surround a portion of each of the active layers.

A more complete understanding of the present invention, as well as further features and advantages of the present invention, will be obtained by reference to the following detailed description and drawings.

DETAILED DESCRIPTION OF PREFERRED EMBODIMENTS

As provided above, in order to prevent leakage from the source to drain via the substrate, field effect transistor (FET) devices having a scaled gate length such as nanosheet FET devices need bottom dielectric isolation. However, parasitic epitaxial growth of nodules from below the bottom dielectric isolation region can connect with the source and drain epitaxy above the dielectric isolation region, thus altogether defeating the purpose of having a bottom dielectric isolation region.

In an attempt to avoid growth of these sub dielectric isolation region parasitic nodules, some fabrication process flows do not perform a full spacer pulldown in the source and drain region. The notion is that spacer will remain along the source and drain to prevent parasitic epitaxial growth from the sub dielectric isolation region.

Doing so, however, can lead to incomplete spacer pulldown in the source and drain regions which causes source and drain epitaxy connectivity issues. For instance, in many instances, the source and drain epitaxy formed by this process only connects the top one or two nanosheets, and completely missing any connection to the nanosheets at the bottom. This occurs because, during growth of the source and drain epitaxy, if the source and drain epitaxy contacts the residual spacers in the source and drain region then no gas can flow to the bottom nanosheets. As a result, no epitaxy occurs at the bottom nanosheets.

Advantageously, it has been found herein that a full spacer pulldown in the source and drain region can be performed, after which a dopant such as arsenic, oxygen and/or nitride ions can be incorporated into the exposed device sidewalls below the bottom dielectric isolation region to prevent parasitic epitaxial growth from these now-doped sidewalls. For instance, if the surface is arsenic, oxygen and/or nitride rich, it is not possible to grow silicon, silicon germanium, etc. on such a surface because the epitaxial growth is surface condition sensitive. As such, the present techniques advantageously enable full spacer pulldown in the source and drain regions before epitaxy thus avoiding any problems associated with incomplete spacer pulldown. Accordingly, connectivity in the source and drain regions is vastly improved. Further, the bottom dielectric isolation effectiveness is improved. Namely, if there is epitaxial nodule nucleation from the substrate below the bottom dielectric isolation, then device performance will be degraded due to substrate leakage.

Figure 1:
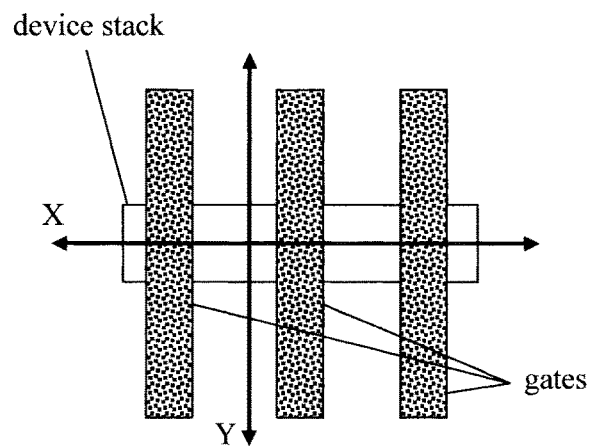
FIG. 1 is a top-down view of the general semiconductor field-effect transistor (FET) design presented herein having at least one device stack and gates oriented orthogonal to the device stacks according to an embodiment of the present invention.

An exemplary methodology for forming a FET device in accordance with the present techniques is now described by way of reference to FIGS. 1-21. In each of the following figures, a cross-sectional view through a part of the FET device will be shown. See, for example, FIG. 1 which depicts a top-down view of the general FET device design illustrating the orientations of the various cuts through the device that will be depicted in the figures. Referring to FIG. 1, the present FET device includes at least one device stack, with gates of the device oriented orthogonal to the device stack. Sacrificial gates are shown in FIG. 1. Namely, as will be described in detail below, a replacement metal gate or RMG process is employed herein where these sacrificial gates serve as placeholders during source and drain formation, and then are later replaced with the replacement metal gates. However, the orientation of the gates with respect to the device stack is the same for both the sacrificial and replacement metal gates.

As shown in FIG. 1, a cross-section X will provide views of cuts through the center of the device stack perpendicular to the gates. A cross-section Y will provide views of cuts through the device stack between two of the gates in a source and drain region of the device.

Figure 2:
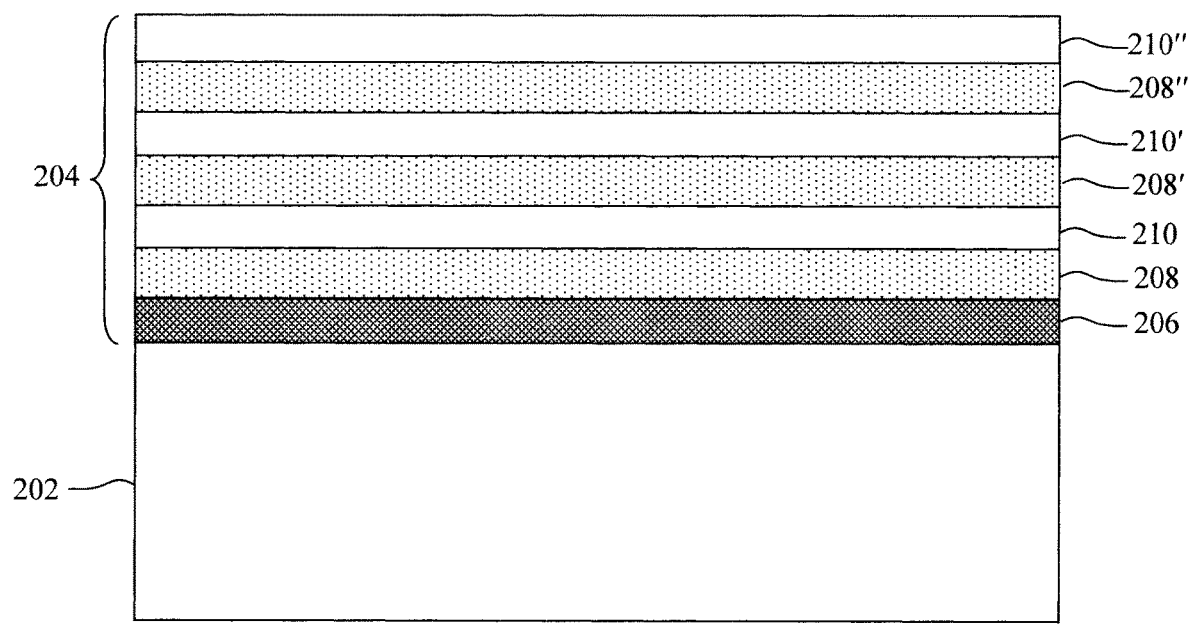
FIG. 2 is a cross-sectional diagram illustrating formation of the at least one device stack on a substrate, the device stack including a first sacrificial layer deposited on the substrate, and alternating second sacrificial layers and active layers deposited on the first sacrificial layer from a cross-sectional view through the center of the device stack perpendicular to the gates according to an embodiment of the present invention.
Figure 3:
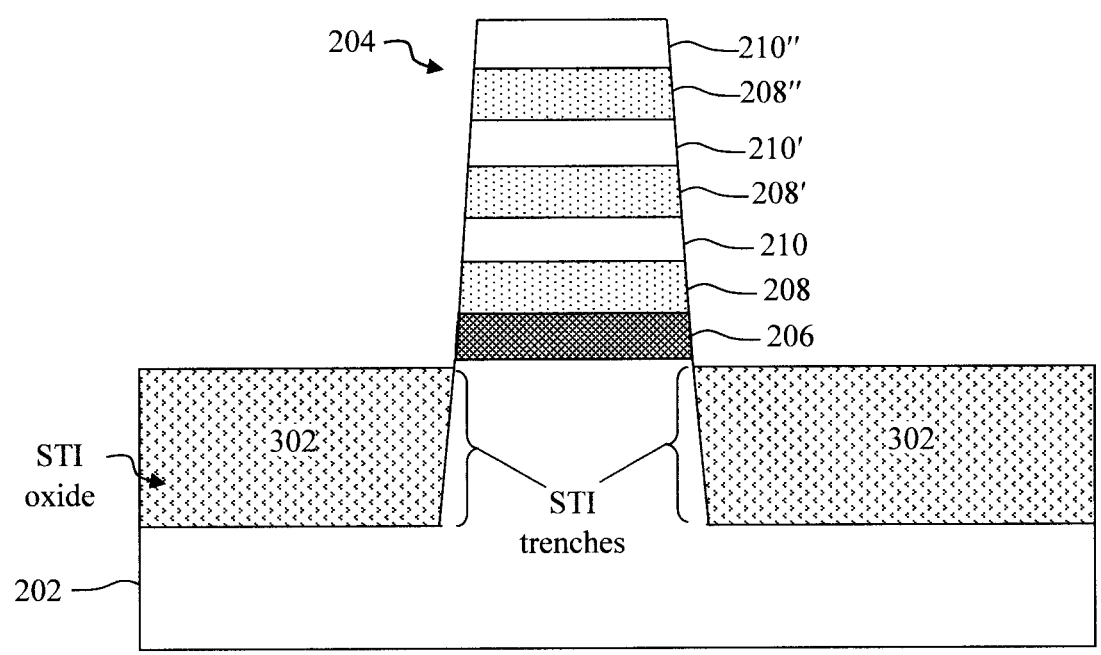
FIG. 3 is a cross-sectional diagram illustrating shallow trench isolation (STI) regions having been formed in the substrate at a base of the device stack from a cross-sectional view through the device stack between two of the gates in a source and drain region of the device according to an embodiment of the present invention.

For instance, as shown in FIG. 2 (a cross-sectional view X), the process begins with the formation of at least one device stack 204 on a substrate 202. According to an exemplary embodiment, substrate 202 is a bulk semiconductor wafer, such as a bulk silicon (Si), bulk germanium (Ge), bulk silicon germanium (SiGe) and/or bulk III-V semiconductor wafer. Alternatively, substrate 202 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 202 may already have pre-built structures (not shown) such as transistors, diodes, capacitors, resistors, interconnects, wiring, etc.

As will be described in detail below, formation of device stack 204 involves first depositing sacrificial and active layers, oriented vertically one on top of another, as a stack on substrate 202, and then using standard lithography and etching techniques to pattern the sacrificial/active layers into at least one individual device stack 204 followed by a shallow trench isolation (STI) process to isolate the device stack(s) 204. By way of example only, in one exemplary embodiment, the sacrificial and active layers are nanosheets. The term 'nanosheet,' as used herein, refers to a sheet or a layer having nanoscale dimensions. Further, the term 'nanosheet' is meant to encompass other nanoscale structures such as nanowires. For instance, 'nanosheet' can refer to a nanowire with a larger width, and/or 'nanowire' can refer to a nanosheet with a smaller width, and vice versa.

With standard lithography and etching processes, a lithographic stack (not shown), e.g., photoresist/organic planarizing layer (OPL)/anti-reflective coating (ARC), is used to pattern a hardmask (not shown) with the footprint and location of each device stack 204. Suitable hardmask materials include, but are not limited to, nitride hardmask materials such as silicon nitride (SiN), silicon oxynitride (SiON), silicon carbide nitride (SiCN), and/or oxide hardmask materials such as silicon oxide (SiOx). Alternatively, the hardmasks can be formed by other suitable techniques, including but not limited to, sidewall image transfer (SIT), self-aligned double patterning (SADP), self-aligned quadruple patterning (SAQP), and other self-aligned multiple patterning (SAMP). An etch is then used to transfer the pattern from the hardmask to the underlying stack of sacrificial and active layers. A directional (anisotropic) etching process such as reactive ion etching (RIE) can be employed for the stack etch.

As shown in FIG. 2, the device stack 204 specifically includes a (first) sacrificial layer 206 deposited on the substrate 202, and alternating layers of (second) sacrificial layers 208, 208', 208", etc. and active layers 210, 210', 210", etc. deposited on sacrificial layer 206. The term 'sacrificial' as used herein refers to a structure that is removed, in whole or in part, during fabrication of the FET device. By contrast, active layers 210, 210', 210", etc. will remain in place and serve as channels of the FET device. It is notable that the number of sacrificial layers 208, 208', 208", etc. and active layers 210, 210', 210", etc. shown in the figures is provided merely as an example to illustrate the present techniques. For instance, embodiments are contemplated herein where more or fewer sacrificial layers sacrificial layers 208, 208', 208", etc. and/or active layers 210, 210', 210", etc. are present than shown.

According to an exemplary embodiment, the sacrificial layer 206 and each of the sacrificial layers 208, 208', 208", etc. and active layers 210, 210', 210", etc. are deposited on substrate 202 using an epitaxial growth process. In one exemplary embodiment, the sacrificial layer 206 and each of the sacrificial layers 208, 208', 208", etc./active layers 210, 210', 210", etc. has a thickness of from about 10 nanometers (nm) to about 25 nm and ranges therebetween.

The materials employed for sacrificial layers 208, 208', 208", etc. and active layers 210, 210', 210", etc. are such that the sacrificial layers 208, 208', 208", etc. can be removed selective to the active layers 210, 210', 210", etc. during fabrication. Further, as will be described in detail below, the material employed for sacrificial layers 208, 208', 208", etc. needs to be such that sacrificial layer 206 can be removed selective to sacrificial layers 208, 208', 208", etc. during fabrication in order to form a bottom dielectric isolation layer.

For instance, according to an exemplary embodiment, sacrificial layer 206 and sacrificial layers 208, 208', 208", etc. are each formed from SiGe, while active layers 210, 210', 210", etc. are formed from Si. Etchants such as wet hot SC1, vapor phase hydrogen chloride (HCl), vapor phase chlorine trifluoride (ClF$_3$) and other reactive clean processes (RCP) are selective for etching of SiGe versus Si.

Further, high germanium (Ge) content SiGe can be removed selective to low Ge content SiGe using an etchant such as dry HCl. Thus, according to an exemplary embodiment, sacrificial layer 206 is formed from SiGe having a high Ge content. For instance, in one exemplary embodiment, a high Ge content SiGe is SiGe having from about 50% Ge to about 100% Ge (i.e., pure Ge) and ranges therebetween. For instance, in one non-limiting example, sacrificial layer 206 is formed from SiGe60 (which is SiGe having a Ge content of about 60%). Use of a higher Ge content SiGe will enable sacrificial layer 206 to be etched selective to sacrificial layers 208, 208', 208", etc. when forming the bottom dielectric isolation layer (see below). In that case, sacrificial layers 208, 208', 208", etc. are preferably formed from a low Ge content SiGe. For instance, in one exemplary embodiment, a low Ge content SiGe is SiGe having from about 20% Ge to about 50% Ge and ranges therebetween. For instance, in one non-limiting example, sacrificial layers 208, 208', 208", etc. are formed from SiGe30 (which is SiGe having a Ge content of about 30%).

As highlighted above, an STI process is used to isolate the individual device stack(s) 204. An STI process generally involves patterning trenches in a substrate, and then filling the trenches with a dielectric material such as an oxide material (which may also be generally referred to herein as an 'STI oxide') to form STI regions. These STI regions are not visible in the depiction shown in FIG. 2. Thus, referring to FIG. 3 (a cross-sectional view Y), it can be seen that STI regions 302 are embedded in the substrate 202 at the base of the device stack 204. Although not explicitly shown in the figures, a liner (e.g., a thermal oxide or silicon nitride (SiN)) may be present lining the trenches under the STI oxide.

Figure 4:
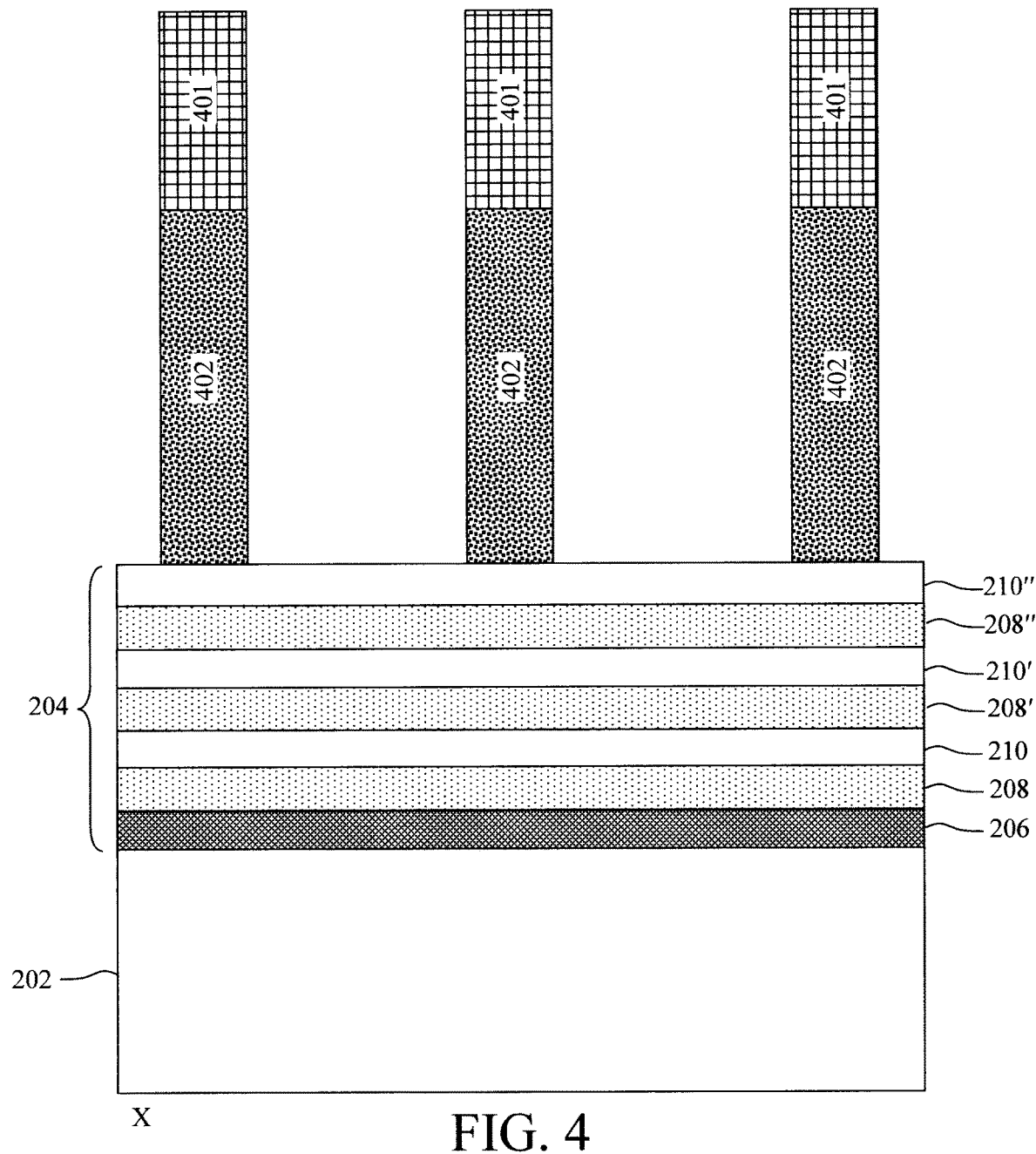
FIG. 4 is a cross-sectional diagram illustrating sacrificial gate hardmasks and sacrificial gates having been formed on the device stack over channel regions of the FET device from a cross-sectional view through the center of the device stack perpendicular to the gates according to an embodiment of the present invention.

As described above, a replacement metal gate or RMG process is employed whereby sacrificial gates are placed early on in the process to enable formation of the source and drains. The sacrificial gates are later removed and replaced with replacement metal gates. Namely, as shown in FIG. 4 (a cross-sectional view X), sacrificial gates 402 are formed on the device stack 204 over channel regions of the FET device. To form sacrificial gates 402, a sacrificial gate material is first blanket deposited over the device stack 204. Suitable sacrificial gate materials include, but are not limited to, ploy-silicon (poly-Si) and/or amorphous silicon (a-Si). A process such as chemical vapor deposition (CVD), atomic layer deposition (ALD) or physical vapor deposition (PVD) can be employed to deposit the sacrificial gate material over the device stack 204.

Sacrificial gate hardmasks 401 are then formed on the sacrificial gate material marking the footprint and location of each of the sacrificial gates 402. Suitable materials for the sacrificial gate hardmasks 401 include, but are not limited to, nitride hardmask materials such as silicon nitride (SiN), silicon oxynitride (SiON) and/or silicon carbide nitride (SiCN), and/or oxide hardmask materials such as silicon oxide (SiOx). An etch using the sacrificial gate hardmasks 401 is then employed to pattern the sacrificial gate material into the individual sacrificial gates 402 shown in FIG. 4. A directional (anisotropic) etching process such as RIE can be employed for the sacrificial gate etch.

Figure 5:
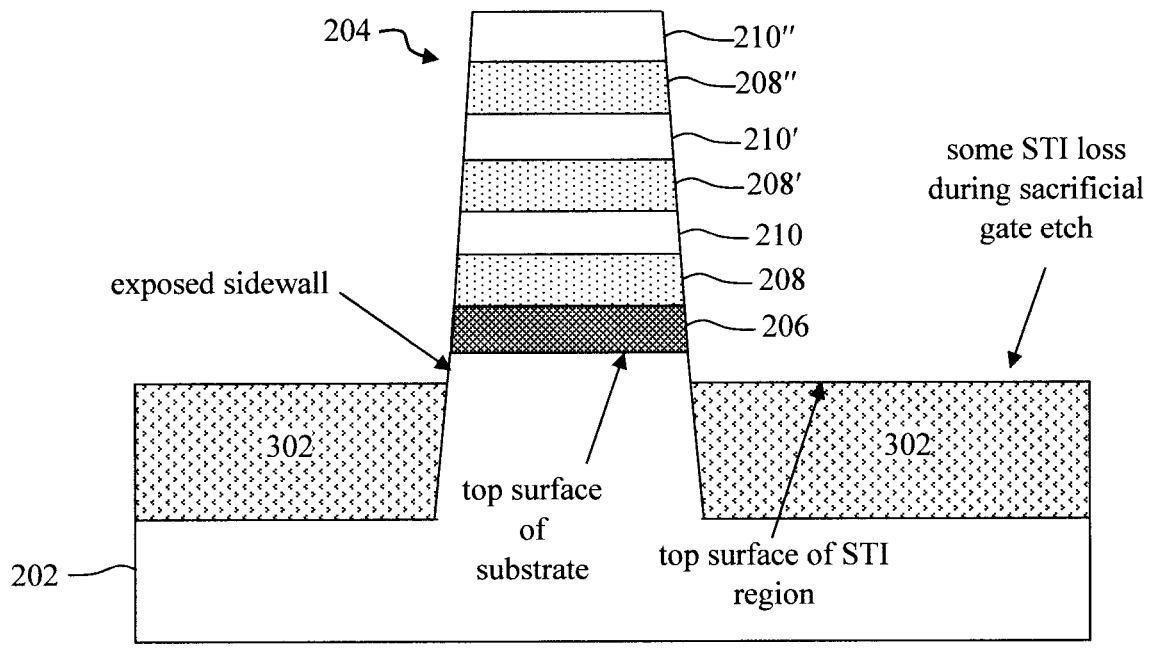
FIG. 5 is a cross-sectional diagram illustrating recess of the STI regions that occurs during formation of the sacrificial gates from a cross-sectional view through the device stack between two of the gates in a source and drain region of the device according to an embodiment of the present invention.

Referring to FIG. 5 (a cross-sectional view Y), the sacrificial gates 402 are not visible in this depiction, however it can be seen that there is some recess of the STI regions 302 during formation/patterning of the sacrificial gates 402. Namely, a top surface of the STI regions 302 is now recessed below a top surface of the substrate 202. As shown in FIG. 5, this STI recess can expose a portion of the substrate 202 along the sidewall at the base of the device stack 204. Notably, this exposed sidewall of substrate 202 is below/under the sacrificial layer 206. As highlighted above, the sacrificial layer 206 will eventually be removed and replaced with a bottom dielectric isolation layer (see below). Further STI loss can also occur during the sacrificial gate post etch clean exposing more of the sidewall. If no action is taken to address this exposed substrate sidewall, then during source and drain epitaxy parasitic epitaxial growth of nodules from below the bottom dielectric isolation region can connect with the source and drain epitaxy above the dielectric isolation region, thereby defeating the purpose of having a bottom dielectric isolation region. Advantageously, a dopant implant such as arsenic, oxygen and/or nitride will be performed at this exposed sidewall of substrate 202 to suppress epitaxy nucleation at this implanted surface, thus preventing epitaxy nodule formation.

Figure 6:
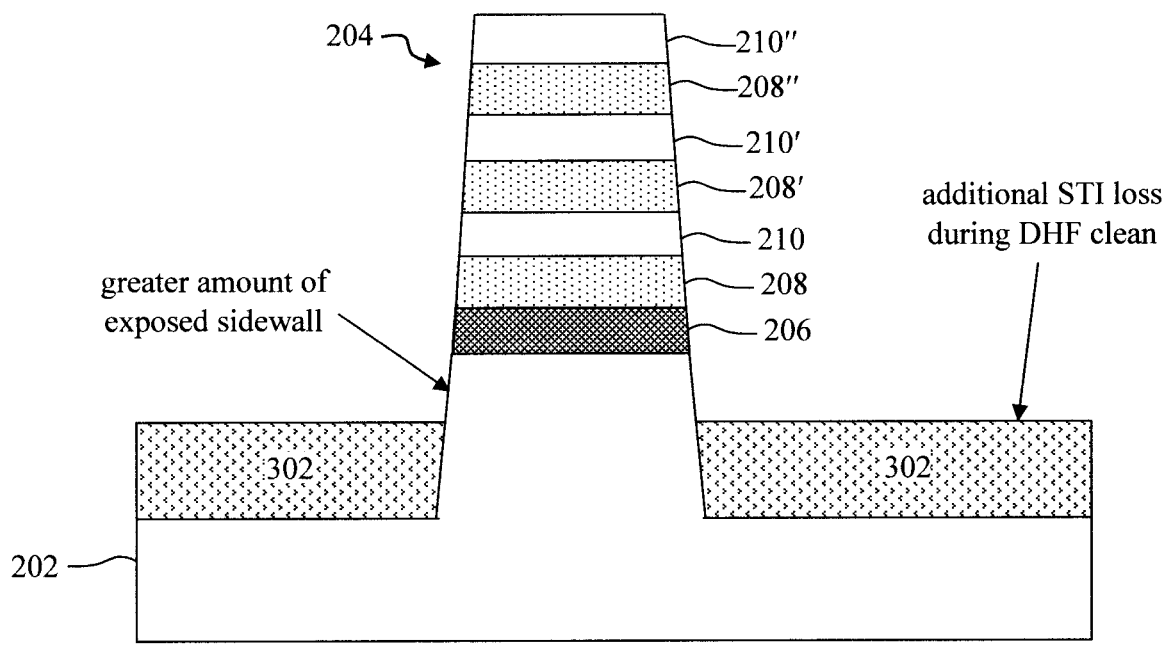
FIG. 6 is a cross-sectional diagram illustrating further recess of the STI regions that occurs when a post etch clean is performed from a cross-sectional view through the device stack between two of the gates in a source and drain region of the device according to an embodiment of the present invention.
Figure 7:
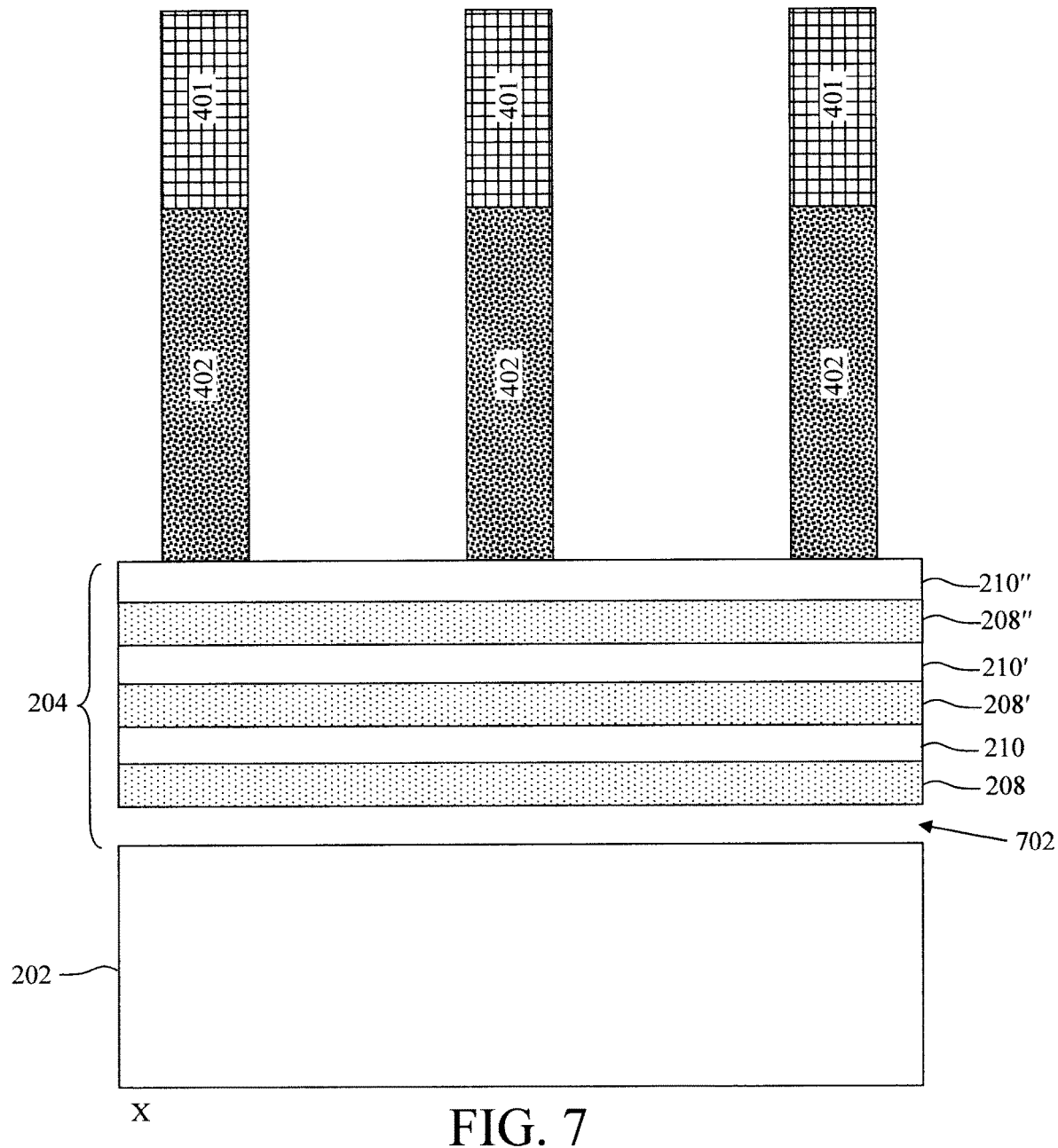
FIG. 7 is a cross-sectional diagram illustrating the first sacrificial layer having been removed from the device stack forming a cavity in the device stack from a cross-sectional view through the center of the device stack perpendicular to the gates according to an embodiment of the present invention.

Following patterning of the sacrificial gates 402, a post etch clean can be performed. Namely, as provided above, an etch process such as RIE can be used to pattern the sacrificial gates 402. A RIE etch typically leaves behind a damaged layer on the patterned surface, which can be removed using a clean with dilute hydrofluoric acid (dHF). Doing so, however, results in further recess of the STI regions 302. As shown in FIG. 6 (a cross-sectional view Y), further recess of the STI regions 302 exposes a greater portion of the sidewall of substrate 202 below sacrificial layer 206.

Figure 8:
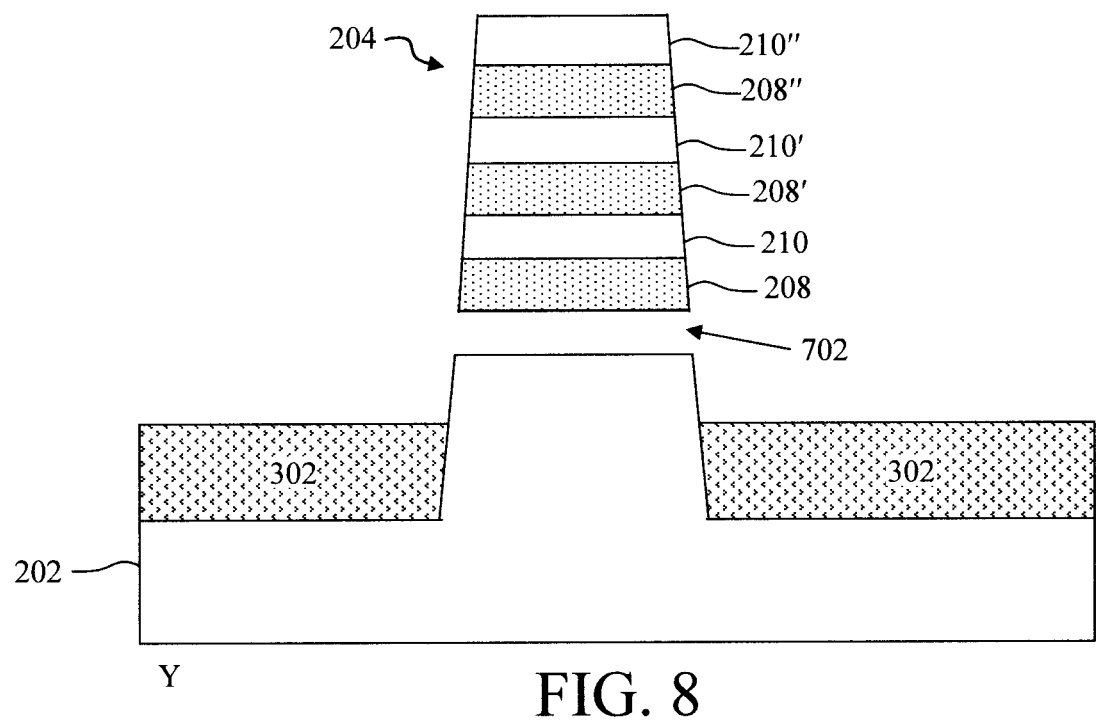
FIG. 8 is a cross-sectional diagram illustrating the first sacrificial layer having been removed from the device stack forming a cavity in the device stack from a cross-sectional view through the device stack between two of the gates in a source and drain region of the device according to an embodiment of the present invention.
Figure 9:
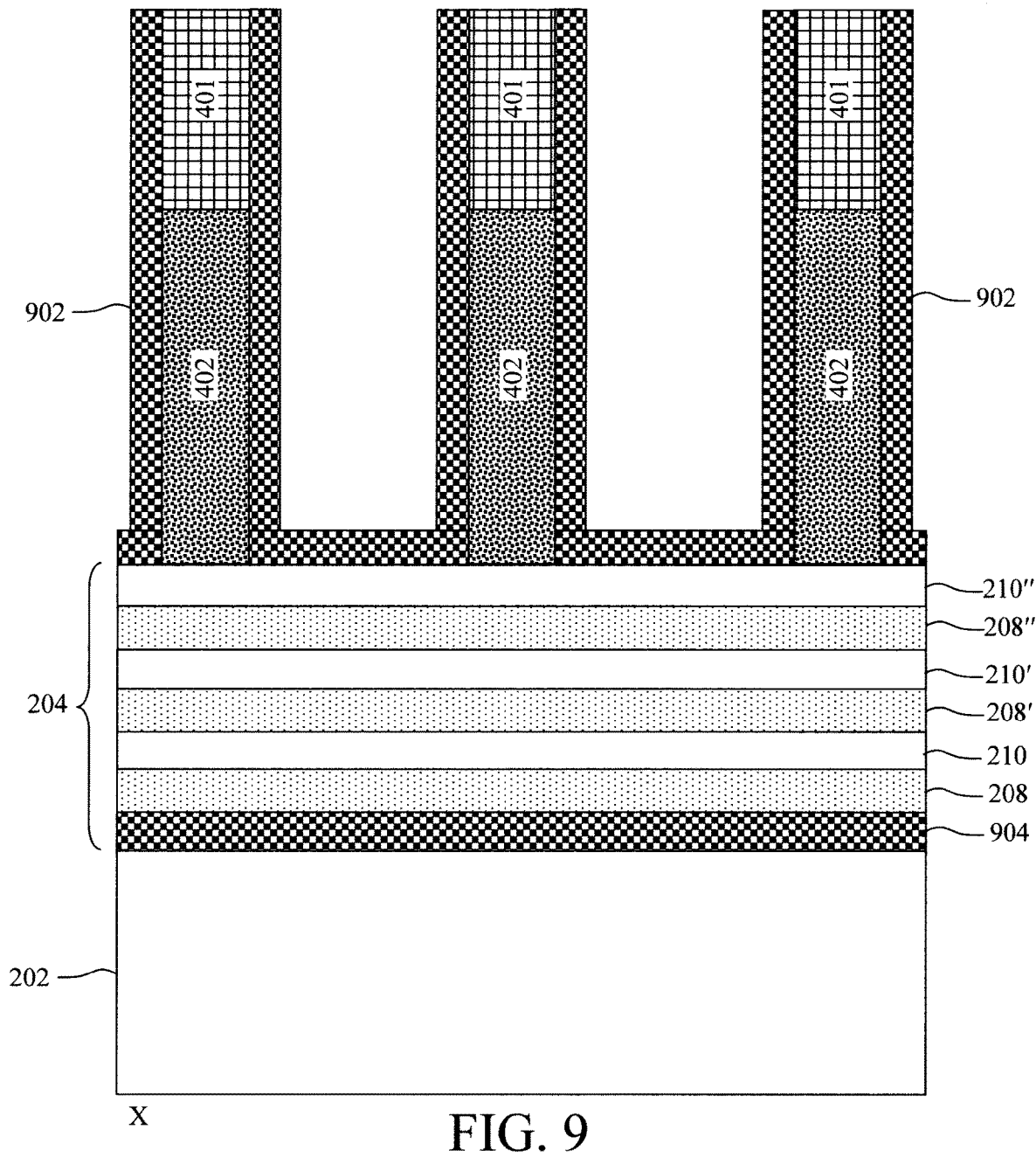
FIG. 9 is a cross-sectional diagram illustrating a dielectric material having been deposited onto the sacrificial gates forming spacers, and into the cavity to form a bottom dielectric isolation layer from a cross-sectional view through the center of the device stack perpendicular to the gates according to an embodiment of the present invention.

The sacrificial layer 206 is then removed from device stack 204 forming a cavity 702 in device stack 204. See FIG. 7 (a cross-sectional view X). The sacrificial layer will be replaced with a bottom dielectric isolation layer. As provided above, sacrificial layer 206 can be formed from high Ge content SiGe (e.g., SiGe having from about 50% Ge to about 100% Ge (i.e., pure Ge) and ranges therebetween, such as SiGe60. In that case, an etchant such as dry HCl can be used to selectively remove sacrificial layer 206. FIG. 8 (a cross-sectional view Y) illustrates removal of the sacrificial layer 206 from another perspective. As shown in FIG. 8, removal of sacrificial layer 206 forms the cavity 702 in device stack 204. It is notable that the device stack 204 is supported by the sacrificial gates 402 which run continuously (see FIG. 1—described above) orthogonal to the device stack 204.

Figure 10:
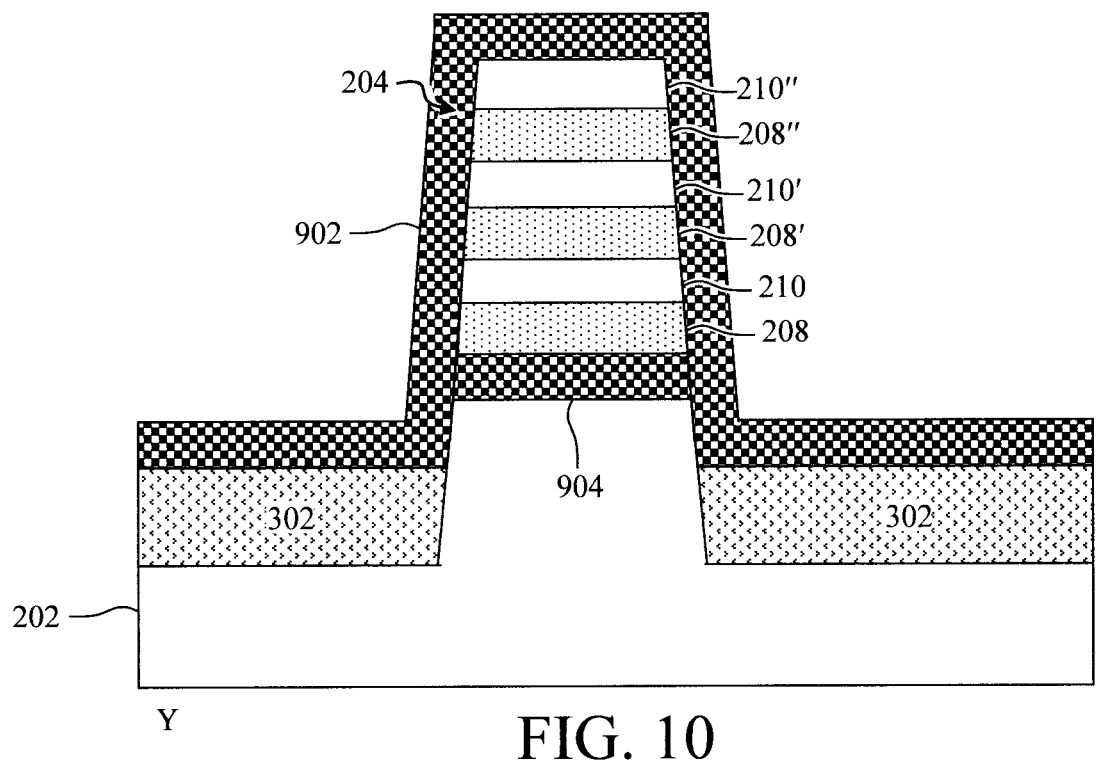
FIG. 10 is a cross-sectional diagram illustrating the dielectric material having been deposited onto the sacrificial gates forming the spacers, and into the cavity to form the bottom dielectric isolation layer from a cross-sectional view through the device stack between two of the gates in a source and drain region of the device according to an embodiment of the present invention.

Spacers 902 are formed along the sidewalls of the sacrificial gates 402 and sacrificial gate hardmasks 401, and a bottom dielectric isolation layer 904 is formed in cavity 702 in device stack 204. See FIG. 9 (a cross-sectional view X). According to an exemplary embodiment, a process such as CVD, ALD or PVD is used to concurrently deposit a dielectric material i) onto the sacrificial gates 402/sacrificial gate hardmasks 401 forming the spacers 902, and ii) into and filling cavity 702 to form the bottom dielectric isolation layer 904. Following deposition, the dielectric material can be planarized using a process such as chemical mechanical polishing (CMP). Suitable dielectric materials for spacers 902 and bottom dielectric isolation layer 904 include, but are not limited to, SiOx and/or silicon nitride (SiN). FIG. 10 (a cross-sectional view Y) illustrates formation of spacers 902 and bottom dielectric isolation layer 904 from another perspective.

Figure 11:
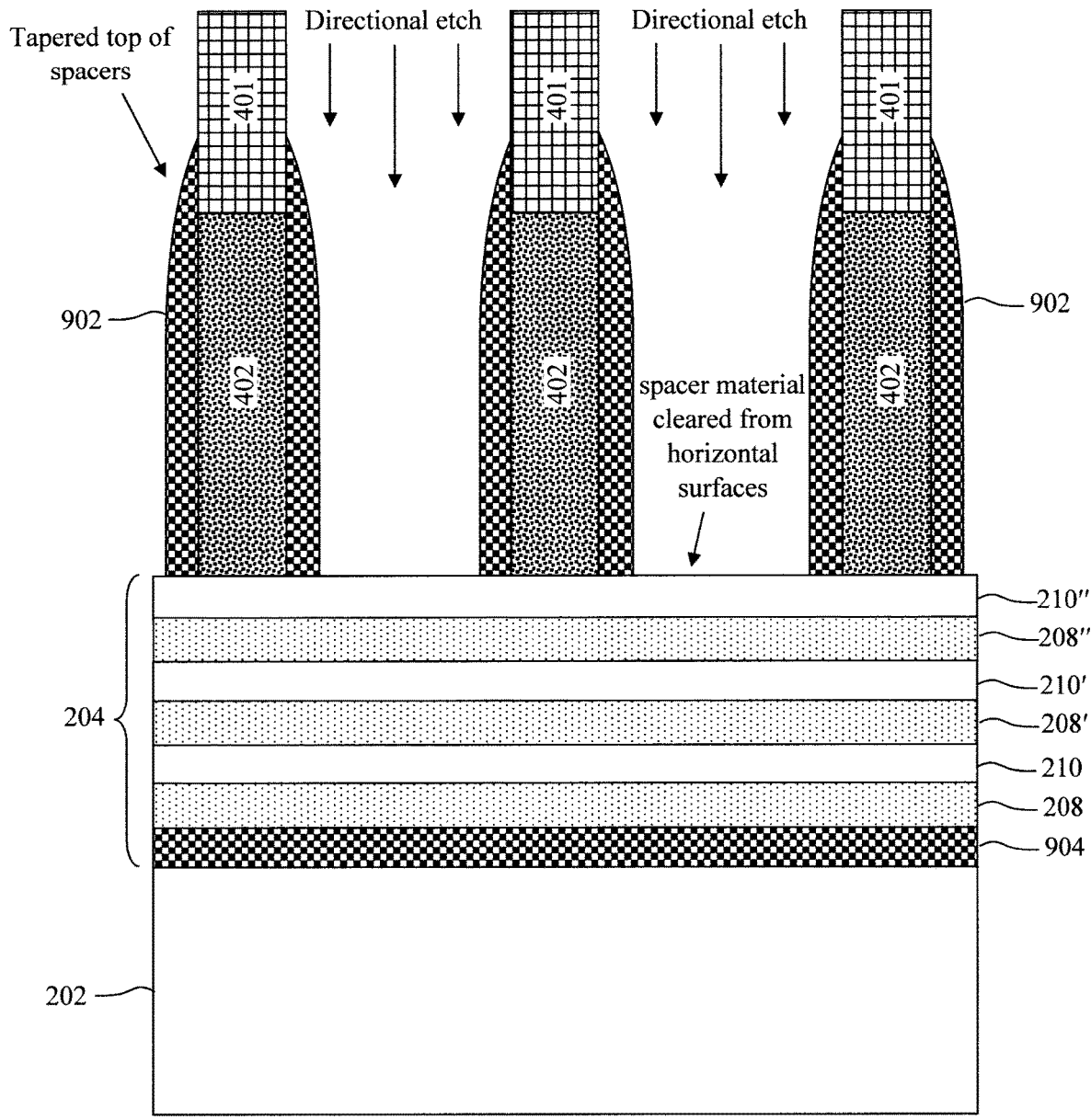
FIG. 11 is a cross-sectional diagram illustrating a directional etch having been performed to remove the dielectric material from horizontal top surface of the device stack in between the sacrificial gates from a cross-sectional view through the center of the device stack perpendicular to the gates according to an embodiment of the present invention.

A directional (anisotropic) etch such as RIE is then performed to remove the dielectric material from horizontal surfaces (such as the horizontal top surface of the device stack 204 in between the sacrificial gates 402) and from the sidewall of device stack 204. See FIG. 11 (a cross-sectional view X). For instance, by comparison with FIG. 9 (described above), it can be seen that the spacer material that forms spacers 902 and bottom dielectric isolation layer 904 has now been cleared from the top of the device stack 204 in between the sacrificial gates 402. As shown in FIG. 11, this etch also tapers the tops of spacers 902, and slightly recessing the spacers 902 below the tops of sacrificial gate hardmasks 401.

Figure 12:
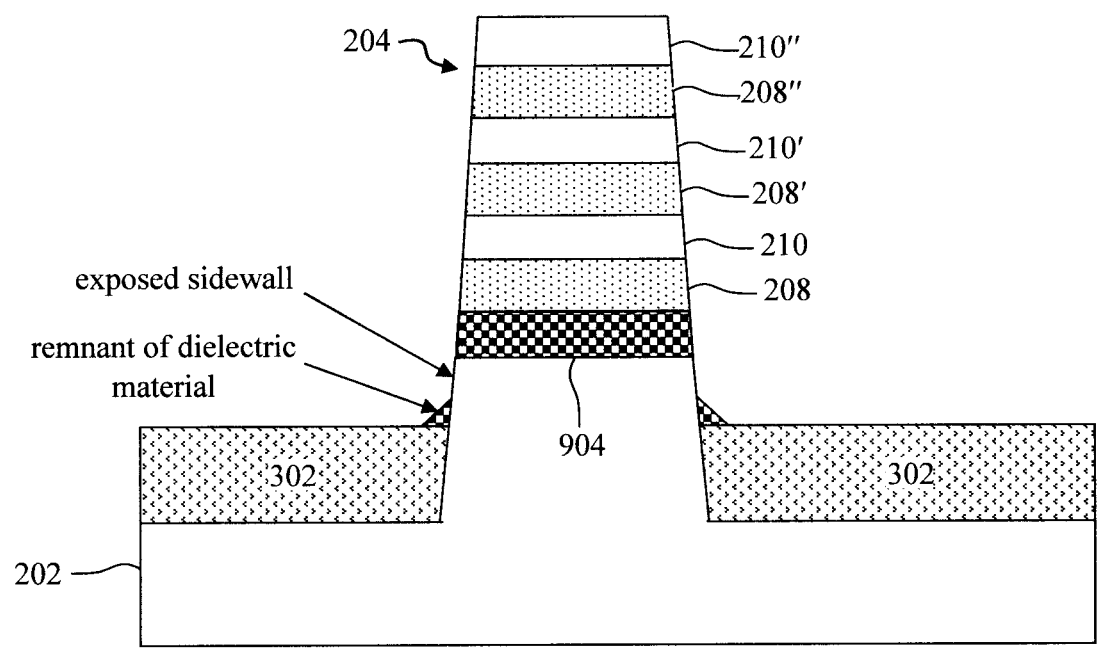
FIG. 12 is a cross-sectional diagram illustrating the directional etch having been performed to remove the dielectric material from the tapered angle sidewall of the device stack from a cross-sectional view through the device stack between two of the gates in a source and drain region of the device according to an embodiment of the present invention.

This directional etch of the dielectric material is illustrated from another perspective in FIG. 12 (a cross-sectional view Y). Notably, as shown in FIG. 12, the sidewall of device stack 204 is downward-sloping, tapered angle (i.e., the device stack 204 is widest at its base and narrowest at the top, with a width that gradually decreases from the base to the top). This tapered angle sidewall is due to the high aspect ratio of the device stack 204 and patterning using a top-down process such as RIE. Advantageously, this tapered angle helps in the removal of the dielectric material from the device stack 204 sidewall. Namely, as shown in FIG. 12, the directional etch (which removes the dielectric material from the horizontal surfaces—see above) also removes a majority of the dielectric material from the sidewall of the device stack 204. This 'full spacer pulldown' in the source and drain regions desirably helps the source and drain epitaxy growth (see below). Specifically, a full spacer pulldown enables the source and drain epitaxy to connect to all of the active layers 210, 210', 210", etc. from the top to the bottom of the device stack 204. This occurs because, during growth of the source and drain epitaxy, gas can flow all the way to the bottom active layer 210, resulting in epitaxy along the whole device stack 204 sidewall.

The etch rate along the horizontal top surface of the device stack 204 and along the downward-sloping, tapered sidewall of device stack 204 is greater than along a vertical surface, such as along the sidewalls of sacrificial gates 402/sacrificial gate hardmasks 401. Thus, in the time it takes to clear the dielectric material from the horizontal top surface of the device stack 204 and the tapered sidewall of device stack 204, spacers 902 will remain along the sidewalls of sacrificial gates 402/sacrificial gate hardmasks 401 (see FIG. 11, described above).

As shown in FIG. 12, a remnant of the dielectric material might remain at the base of the device stack 204. However, a portion of the sidewall of substrate 202 is still exposed under the bottom dielectric isolation layer 904. Advantageously, a dopant implant such as arsenic, oxygen and/or nitride ions will be performed at this exposed sidewall of substrate 202 to suppress epitaxy nucleation at this implanted surface, thus preventing any parasitic epitaxial growth from this exposed sidewall.

Figure 13:
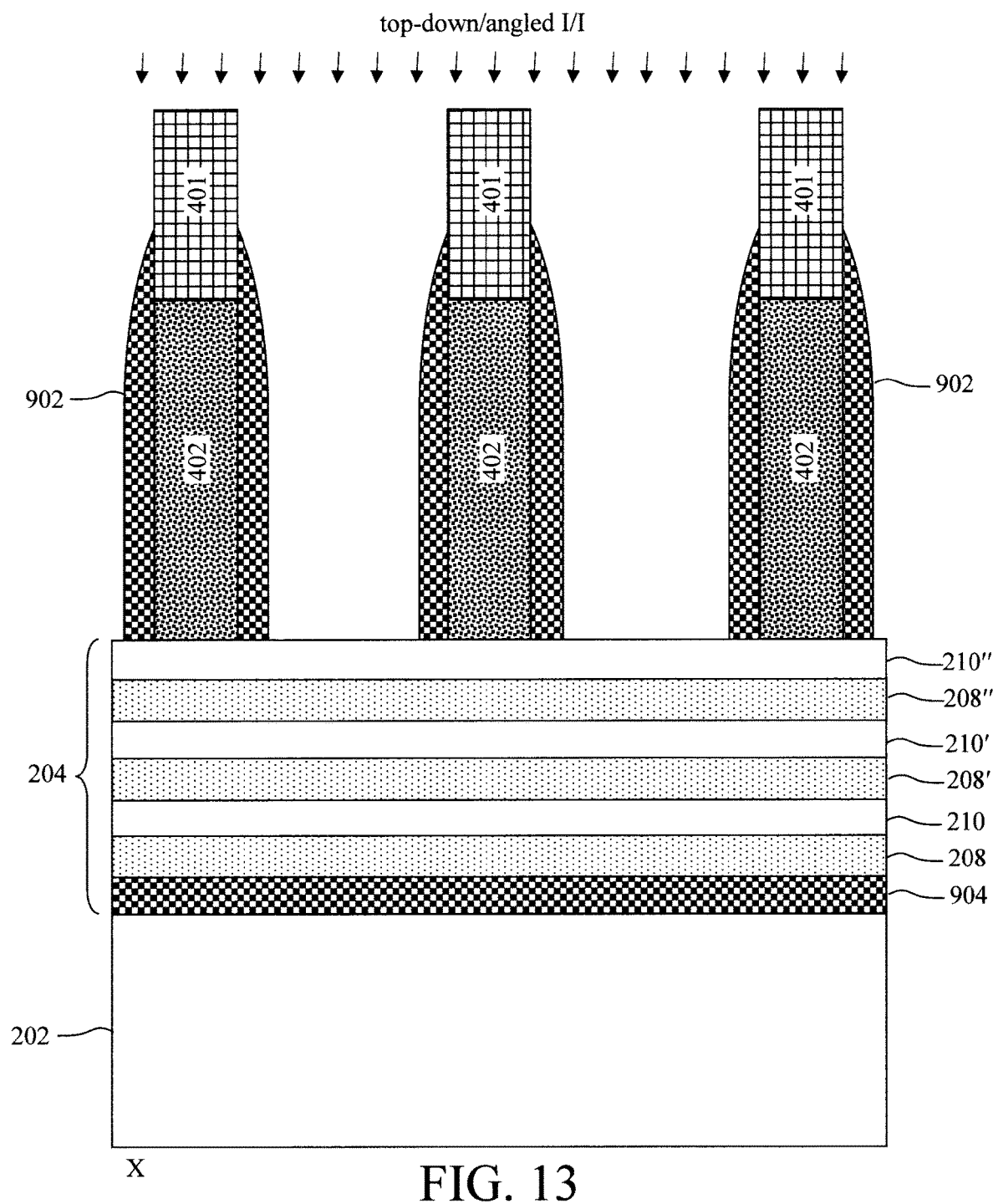
FIG. 13 is a cross-sectional diagram illustrating an ion implant of a dopant(s) such as arsenic, oxygen and/or nitride ions having been performed from a cross-sectional view through the center of the device stack perpendicular to the gates according to an embodiment of the present invention.

Namely, as shown in FIG. 13, an ion implant (I/I) of a dopant(s) such as arsenic, oxygen and/or nitride ions is performed with the ultimate goal of implanting the arsenic, oxygen and/or nitride ions along the exposed sidewall of substrate 202 under the bottom dielectric isolation layer 904. According to an exemplary embodiment, the ion implant is performed from the top-down plus at an angle θ of from about 5° to about 20° and ranges therebetween. This will enable the implantation of the (e.g., arsenic, oxygen and/or nitride) ions into exposed horizontal and tapered angle surfaces along the sidewall of the device stack 204, as well as the sidewalls of sacrificial gate hardmasks 401, spacers 902, etc.

Figure 14:
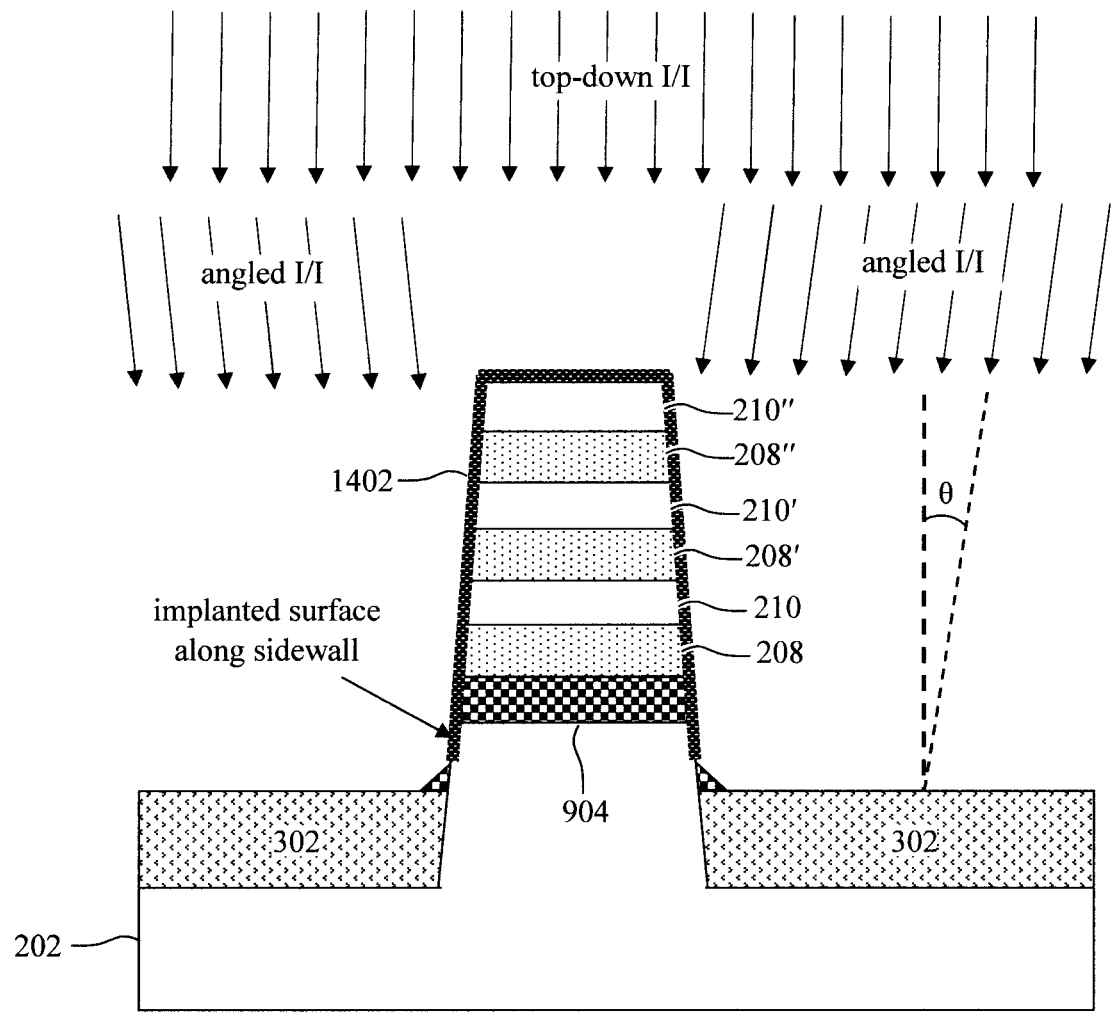
FIG. 14 is a cross-sectional diagram illustrating the ion implant having been performed to implant the ions along the exposed sidewall of the substrate under the bottom dielectric isolation layer from a cross-sectional view through the device stack between two of the gates in a source and drain region of the device according to an embodiment of the present invention.

For instance, as shown in FIG. 14 (a cross-sectional view Y), a top-down and angled (i.e., at an angle θ of from about 5° to about 20° and ranges therebetween) ion implant (I/I) is performed with, e.g., arsenic, oxygen and/or nitride ions, to form an implanted surface 1402 along the (horizontal) top surface and tapered angle sidewall surfaces of the device stack 204. This top-down and angled ion implant can be performed using a commercially available I/I tool. Notably, as shown in FIG. 14 this implanted surface 1402 is present along the exposed sidewall of substrate 202 under the bottom dielectric isolation layer 904. The implantation of ions such as arsenic, oxygen and/or nitride ions serve to amorphize the exposed sidewall of substrate 202 under the bottom dielectric isolation layer 904. Amorphization along the sidewall will help to suppress epitaxy nucleation at this implanted surface. As such no epitaxial growth will occur under the bottom dielectric isolation layer 904.

Figure 15:
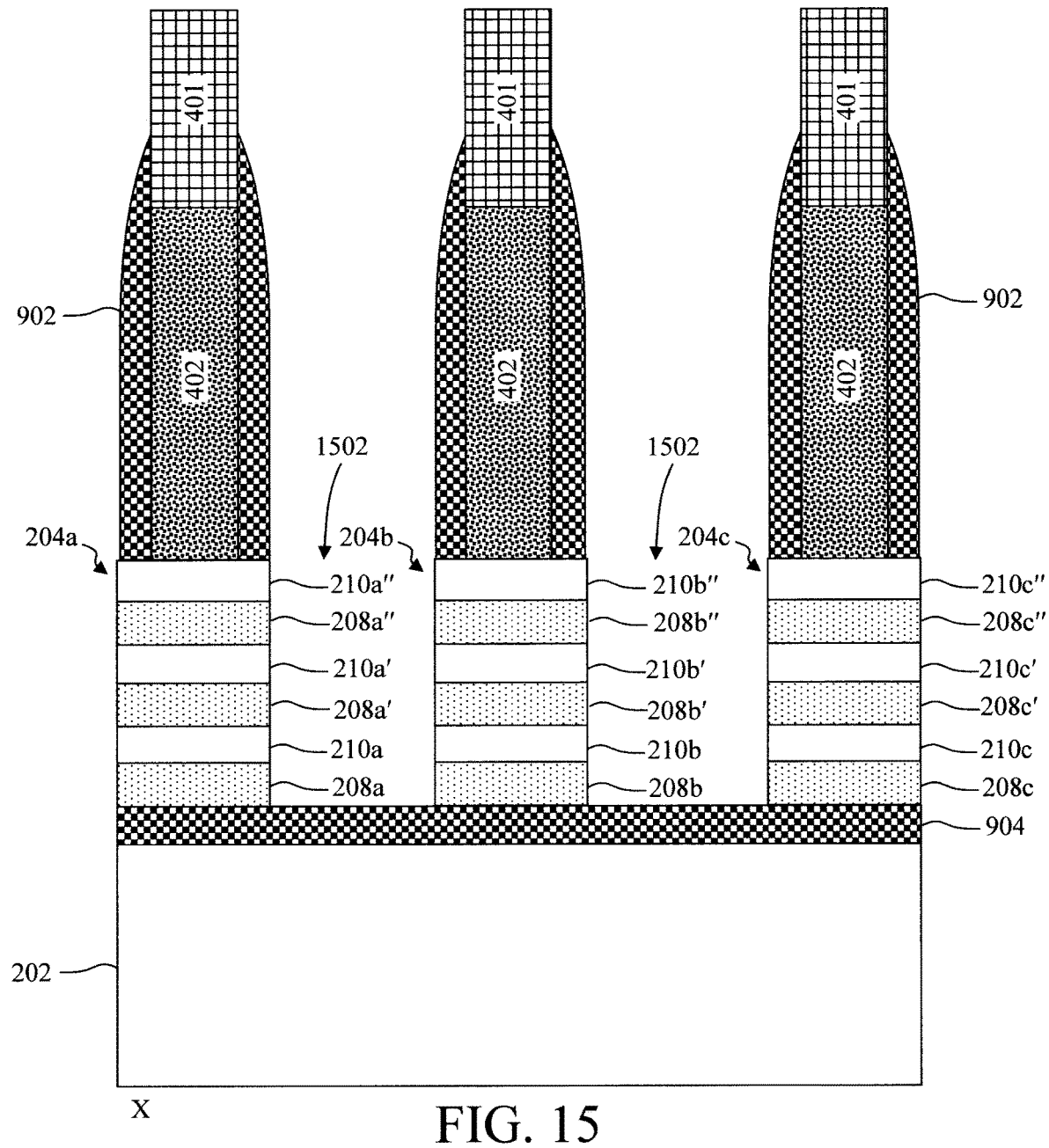
FIG. 15 is a cross-sectional diagram illustrating the sacrificial gate hardmasks, sacrificial gates, and spacers having been used as a mask to pattern trenches in the device stack in between the sacrificial gates and spacers from a cross-sectional view through the center of the device stack perpendicular to the gates according to an embodiment of the present invention.

The sacrificial gate hardmasks 401/sacrificial gates 402/spacers 902 are then used as a mask to pattern trenches 1502 in device stack 204 in between the sacrificial gates 402/spacers 902. See FIG. 15 (a cross-sectional view X). A directional (anisotropic) etching process such as RIE can be employed for the trench 1502 etch. As shown in FIG. 15, trenches 1502 extend through each of the sacrificial layers 208, 208', 208", etc. and active layers active layers 210, 210', 210", etc., stopping on bottom dielectric isolation layer 904.

Figure 16:
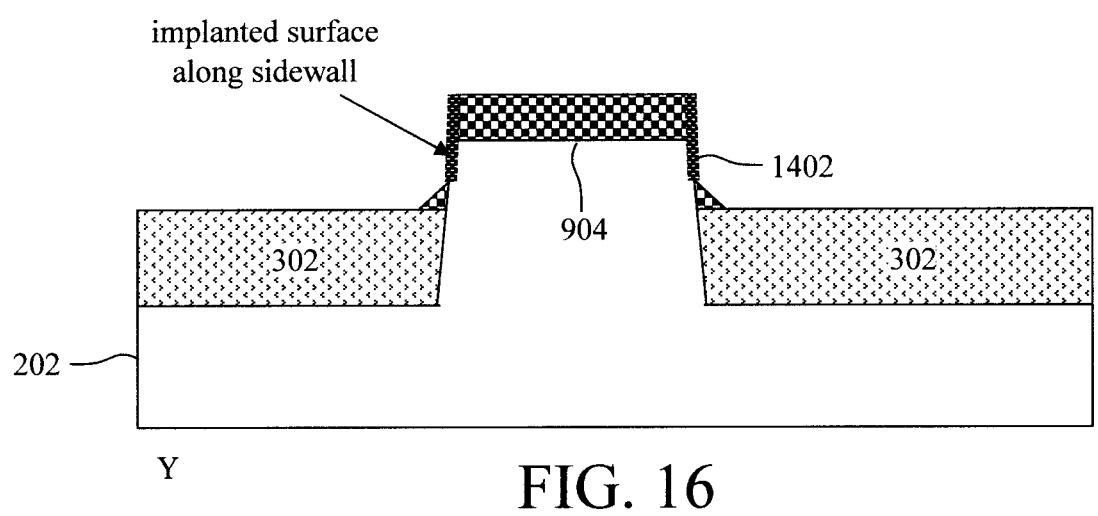
FIG. 16 is a cross-sectional diagram illustrating the trenches having been patterned in the device stack in between the sacrificial gates and spacers from a cross-sectional view through the device stack between two of the gates in a source and drain region of the device according to an embodiment of the present invention.

As shown in FIG. 15, this trench 1502 etch patterns device stack 204 into multiple individual device stacks 204a, 204b and 204c, etc. each including patterned portions of the sacrificial layers 208, 208', 208", etc. and active layers active layers 210, 210', 210", etc. oriented vertically over the bottom dielectric isolation layer 904. The patterned portions of the sacrificial layers 208, 208', 208", etc. and active layers active layers 210, 210', 210", etc. are now designated as 208a,b,c, 208a,b,c', 208a,b,c", etc., and 210a,b,c, 210a,b,c', 210a,b,c", etc., respectively. The trench 1502 etch is illustrated from another perspective in FIG. 16 (a cross-sectional view Y). As shown in FIG. 16, the sacrificial layers 208, 208', 208", etc. and active layers active layers 210, 210', 210", etc. on top of the bottom dielectric isolation layer 904 have been removed in the source and drain regions of the device. Importantly, what remains is the (e.g., arsenic, oxygen and/or nitride ion) implanted surface 1402 along the sidewalls of substrate 202 under bottom dielectric isolation layer 904.

Figure 17:
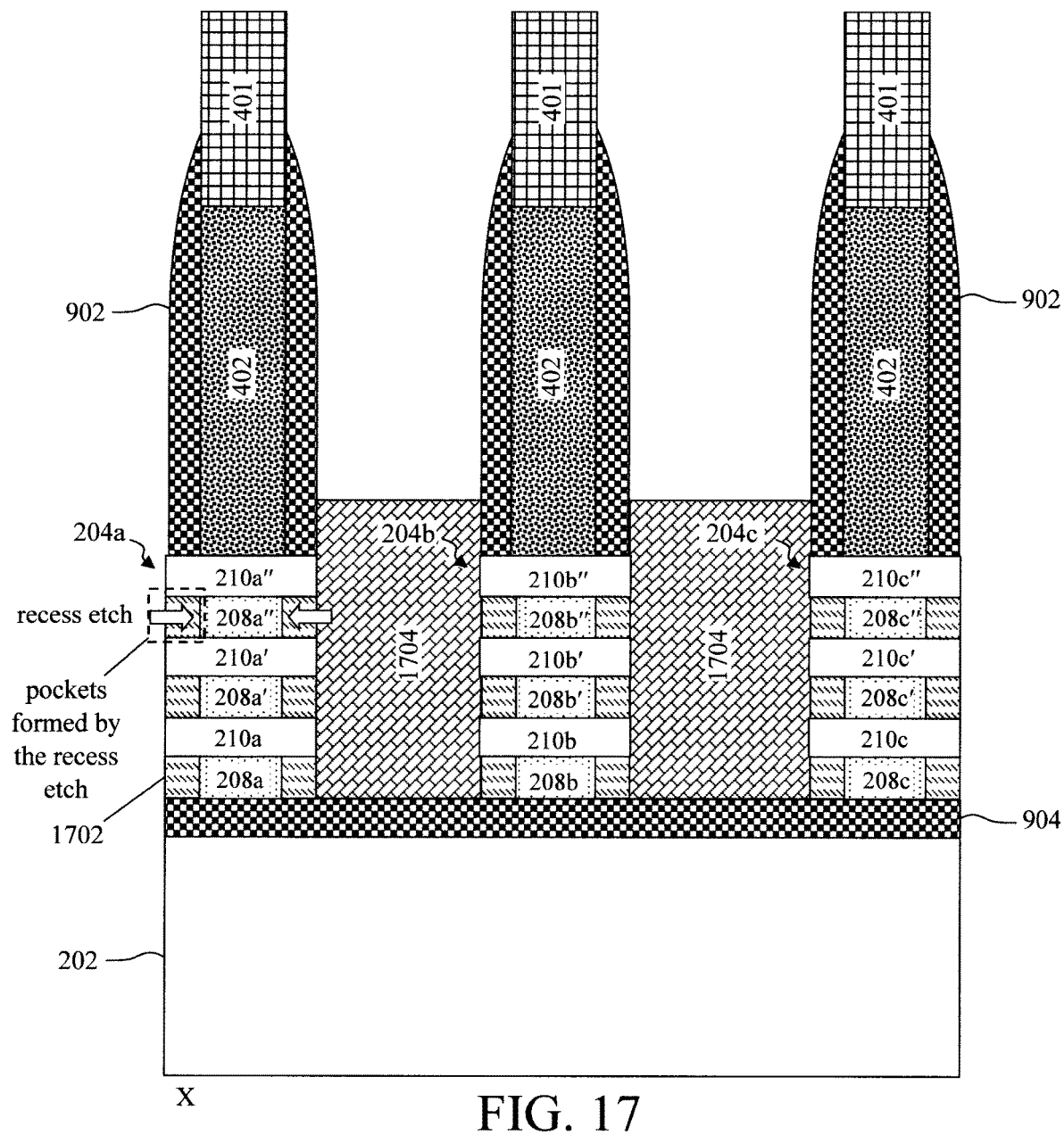
FIG. 17 is a cross-sectional diagram illustrating inner spacers having been formed alongside the sacrificial layers, and source and drains having been formed in the trenches on opposite sides of the second sacrificial layers and the active layers from a cross-sectional view through the center of the device stack perpendicular to the gates according to an embodiment of the present invention.

Source and drains are then formed in the trenches 1502 on opposite sides of the sacrificial layers 208a,b,c, 208a,b,c', 208a,b,c", etc. and active layers and 210a,b,c, 210a,b,c', 210a,b,c", etc. First, however, inner spacers 1702 are formed alongside the sacrificial layers 208a,b,c, 208a,b,c', 208a,b, c", etc. To do so, a selective etch is performed to laterally recess the sacrificial layers 208a,b,c, 208a,b,c', 208a,b,c", etc. exposed along the sidewalls of device stacks 204a, 204b and 204c. See FIG. 17. As shown in FIG. 17, this recess etch forms pockets in the device stacks 204a, 204b and 204c alongside the sacrificial layers 208a,b,c, 208a,b,c', 208a,b, c", etc. that are then filled with a spacer material to form the inner spacers 1702 within the pockets. The inner spacers 1702 will offset the replacement metal gates from the source and drains (see below). As provided above, according to an exemplary embodiment, the sacrificial layers 208a,b,c, 208a,b,c', 208a,b,c", etc. are formed from SiGe. In that case, a SiGe-selective non-directional (isotropic) etching process can be used for the recess etch. Suitable spacer materials for inner spacers 1702 include, but are not limited to, silicon nitride (SiN), silicon oxide (SiOx), silicon carbide (SiC) and/or silicon oxycarbide (SiCO). A process such as CVD, ALD or PVD can be employed to deposit the spacer material into the pockets, followed by a directional (anisotropic) etching process such as RIE to remove excess spacer material from the trenches 1502.

Source and drains 1704 are then formed in the trenches 1502 on opposite sides of the sacrificial layers 208a,b,c, 208a,b,c', 208a,b,c", etc. and active layers and 210a,b,c, 210a,b,c', 210a,b,c", etc. According to an exemplary embodiment, source and drains 1704 are formed from an in-situ doped (i.e., during growth) or ex-situ doped (e.g., via ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B). With inner spacers 1702 in place along the sidewall of device stacks 204a, 204b and 204c, epitaxial growth of the source and drains 1704 is templated from the (exposed) ends of active layers and 210a,b,c, 210a,b,c', 210a,b,c", etc.

Figure 18:
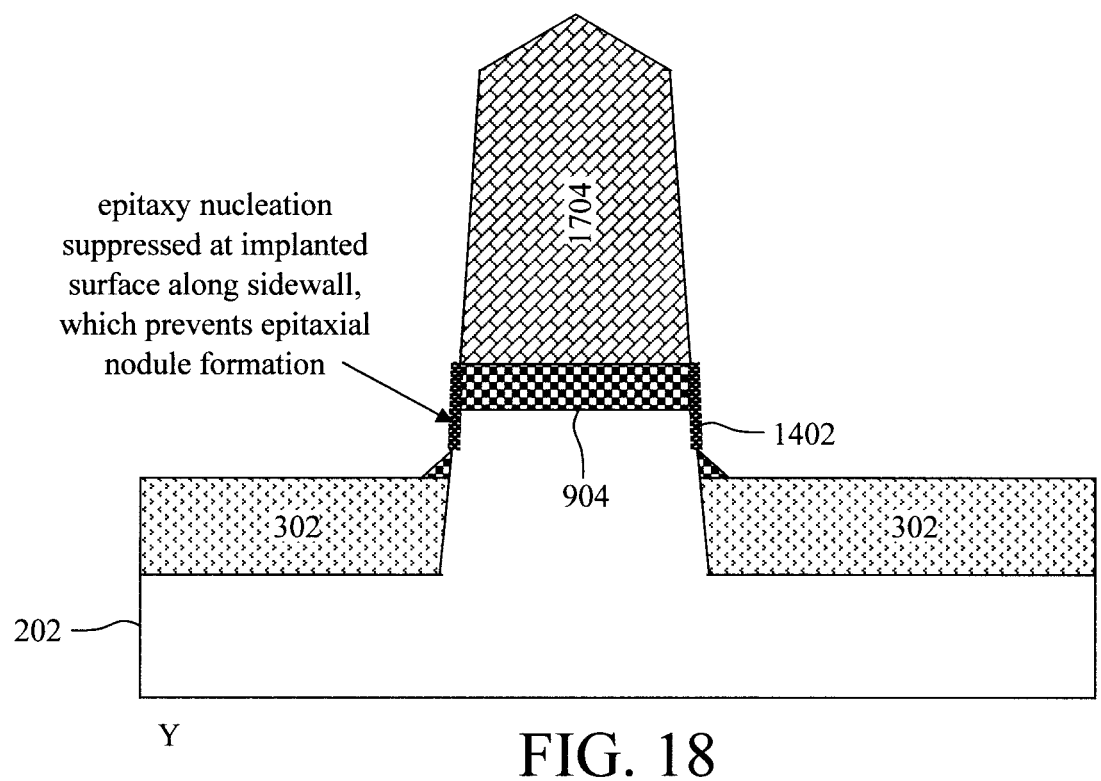
FIG. 18 is a cross-sectional diagram illustrating that the source and drains are formed only above the bottom dielectric isolation layer from a cross-sectional view through the device stack between two of the gates in a source and drain region of the device according to an embodiment of the present invention.

The formation of the source and drains 1704 is illustrated from another perspective in FIG. 18 (a cross-sectional view Y). As shown in FIG. 18, the source and drains 1704 epitaxy is only present above the bottom dielectric isolation layer 904. Namely, the epitaxial nucleation is suppressed at the (e.g., As) implanted surface 1402 under the bottom dielectric isolation layer 904, which advantageously prevents epitaxial nodule formation at this implanted surface 1402. To look at it another way, the source and drains 1704 epitaxy is absent along the implanted surface 1402 under the bottom dielectric isolation layer 904. As highlighted above, epitaxial nodule formation under the bottom dielectric isolation layer which connects with the source and drains would undesirably defeat the purpose of forming the dielectric isolation region in the first place.

Following formation of the source and drains 1704, the sacrificial gate hardmasks 401 and sacrificial gates 402 are selectively removed. To do so, the sacrificial gate hardmasks 401 and sacrificial gates 402 are first surrounded in an interlayer dielectric (ILD) 1902. The sacrificial gate hardmasks 401 and sacrificial gates 402 are then selectively removed forming gate trenches 1904 in the ILD 1902 over the device stacks 204a, 204b, and 204c. See FIG. 19 (a cross-sectional view X). Suitable ILD materials include, but are not limited to, oxide low-κ materials such as silicon oxide (SiOx) and/or oxide ultralow-K interlayer dielectric (ULK-ILD) materials, e.g., having a dielectric constant κ of less than 2.7. By comparison, silicon dioxide (SiO$_2$) has a dielectric constant κ value of 3.9. Suitable ultralow-κ dielectric materials include, but are not limited to, porous organosilicate glass (pSiCOH). A process such as CVD, ALD or PVD can be employed to deposit ILD 1902 around the sacrificial gate hardmasks 401 and sacrificial gates 402. Following deposition, ILD 1902 can be planarized using a process such as chemical mechanical polishing (CMP).

Figure 19:
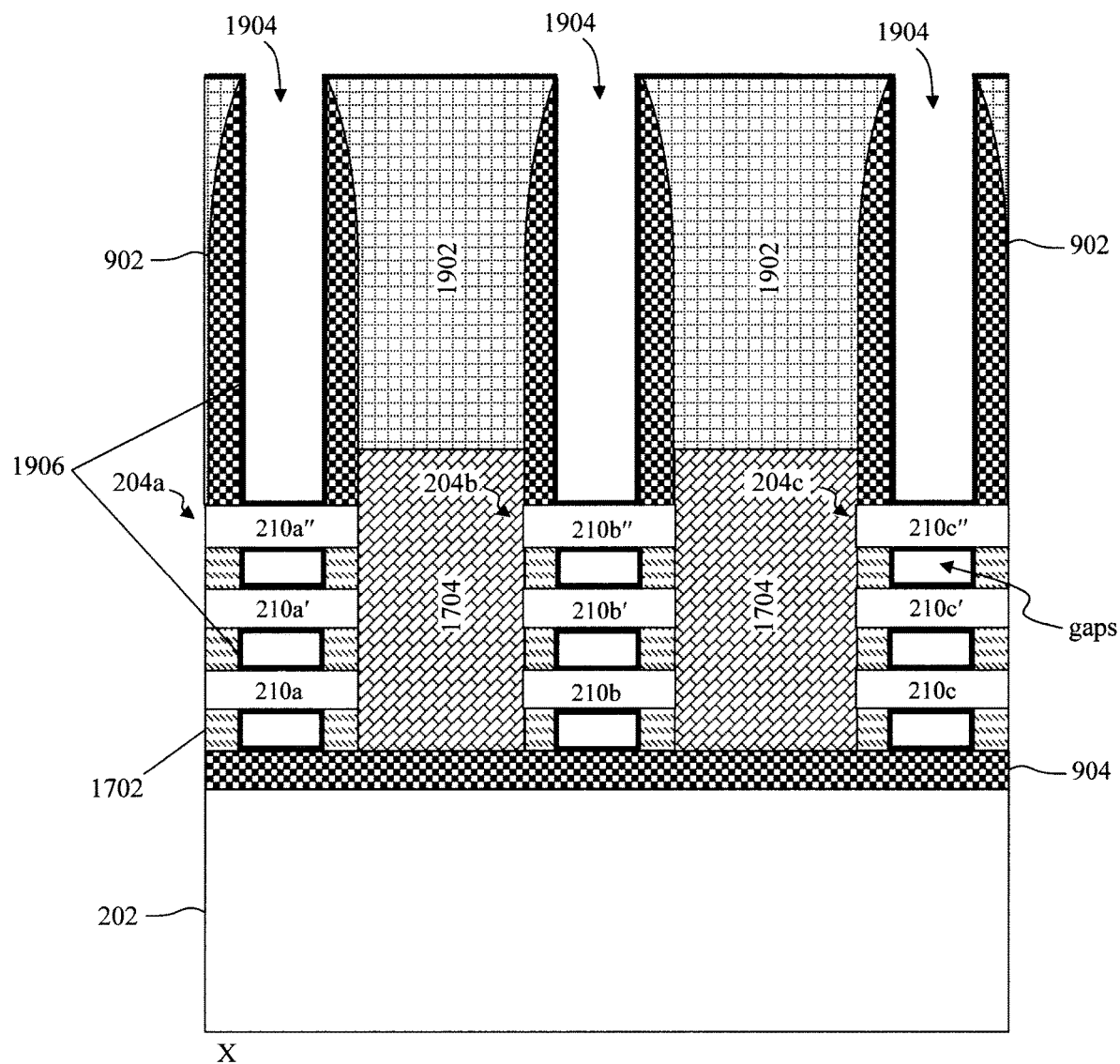
FIG. 19 is a cross-sectional diagram illustrating the sacrificial gate hardmasks and sacrificial gates having been surrounded in an interlayer dielectric (ILD), the sacrificial gate hardmasks and the sacrificial gates having been selectively removed forming gate trenches in the ILD, the second sacrificial layers having been selectively removed forming gaps in between the active layers, and a conformal gate dielectric having been deposited into and lining each of the gate trenches and gaps from a cross-sectional view through the center of the device stack perpendicular to the gates according to an embodiment of the present invention.

Following removal of the sacrificial gate hardmasks 401 and sacrificial gates 402, the sacrificial layers 208a,b,c, 208a,b,c', 208a,b,c'', etc., which are now accessible through the gate trenches 1904, are then selectively removed. Removal of sacrificial layers 208a,b,c, 208a,b,c', 208a,b,c'', etc. releases the active layers 210a,b,c, 210a,b,c', 210a,b,c'', etc. from the device stacks 204a, 204b, and 204c, respectively, in the channel region of the device. As shown in FIG. 19, gaps are now present in the device stacks 204a, 204b, and 204c in between the active layers 210a,b,c, 210a,b,c', 210a,b,c'', etc. in the channel region of the device. Active layers 210a,b,c, 210a,b,c', 210a,b,c'', etc. will be used to form the channels of the FET device. The gate trenches 1904 and the gaps in the device stacks 204a, 204b, and 204c enable replacement metal gates, i.e., including a gate dielectric and at least one workfunction-setting metal, to be formed that fully surround a portion of each of the active layers 210a,b,c, 210a,b,c', 210a,b,c'', etc. in a gate-all-around or GAA configuration.

For instance, a conformal gate dielectric 1906 is first deposited into and lining each of the gate trenches 1904 and gaps such that the conformal gate dielectric 1906 is now present on the active layers 210a,b,c, 210a,b,c', 210a,b,c'', etc. in the channel region of the semiconductor FET device. According to an exemplary embodiment, gate dielectric 1906 is a high-κ material. The term "high-κ," as used herein, refers to a material having a relative dielectric constant κ which is much higher than that of silicon dioxide (e.g., a dielectric constant κ=25 for hafnium oxide (HfO$_2$) rather than 4 for SiO$_2$). Suitable high-κ gate dielectric materials include, but are not limited to, HfO$_2$ and/or lanthanum oxide (La$_2$O$_3$). A process such as CVD, ALD or PVD can be employed to deposit gate dielectric 1906. According to an exemplary embodiment, gate dielectric 1906 has a thickness of from about 1 nanometer (nm) to about 5 nm and ranges therebetween. A reliability anneal can be performed following deposition of gate dielectric 1906. In one exemplary embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as a nitrogen-containing ambient.

At least one workfunction-setting metal 2002 is then deposited into the gate trenches 1904 and gaps on the gate dielectric 1906. See FIG. 20 (a cross-sectional view X). Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting metal stacks to improve electrical properties such as gate leakage currents. Thus, there is some overlap in the exemplary n- and p-type workfunction-setting metals given above. A process such as CVD, ALD or PVD can be employed to deposit the workfunction-setting metal(s) 2002. Following deposition, the metal overburden can be removed using a process such as CMP.

According to an exemplary embodiment, the gate dielectric 1906 and workfunction-setting metal(s) 2002 are then recessed, and dielectric gate caps 2004 are formed over the recessed gate dielectric 1906/workfunction-setting metal(s) 2002. Suitable dielectric gate cap materials include, but are not limited to, silicon carbide (SiC) and/or silicon dioxide (SiO$_2$) which can be deposited using a process such as CVD, ALD or PVD. Following deposition, the dielectric gate cap material can be planarized using a process such as CMP, which can also etch back the spacers 902. The dielectric gate caps 2004 serve to cover/protect the replacement metal gates during formation of contacts to the source and drains 1704.

Figure 20:
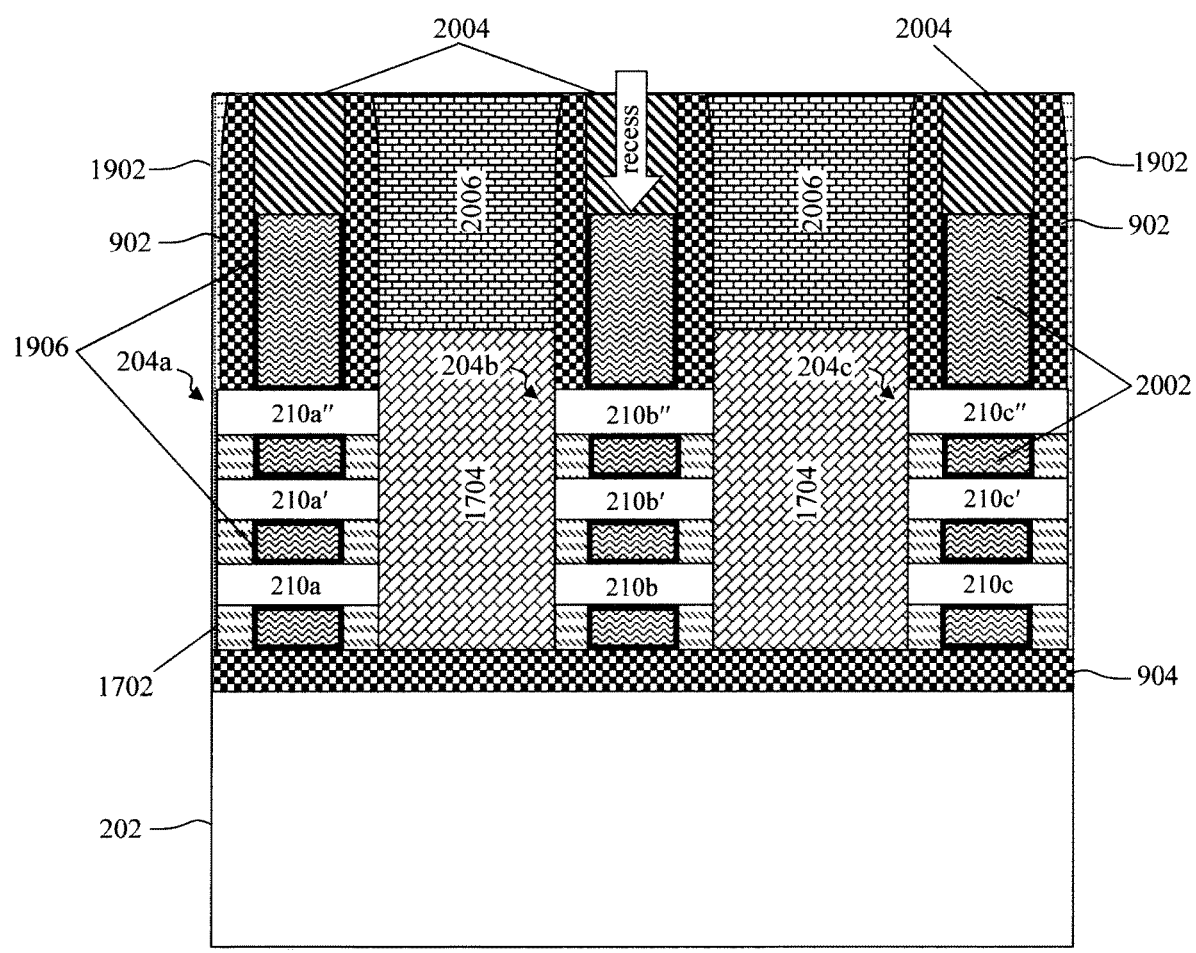
FIG. 20 is a cross-sectional diagram illustrating at least one workfunction-setting metal having been deposited into the gate trenches and gaps on the gate dielectric, the gate dielectric and the workfunction-setting metal(s) having been recessed, dielectric gate caps having been formed over the recessed gate dielectric and workfunction-setting metal(s), and the ILD having been removed from over the source and drains and replaced with a contact metal(s) to form source and drain contacts from a cross-sectional view through the center of the device stack perpendicular to the gates according to an embodiment of the present invention.

Namely, as shown in FIG. 20, the ILD 1902 is removed from over the source and drains 1704 and replaced with a contact metal(s) to form source and drain contacts 2006. Suitable contact metals include, but are not limited to, titanium (Ti), tantalum (Ta), titanium nitride (TiN), tantalum nitride (TaN), cobalt (Co), ruthenium (Ru) and/or tungsten (W), which can be deposited using a process such as evaporation, sputtering, or electrochemical plating. Following deposition, the metal overburden can be removed using a process such as CMP which can further etch back the spacers 902.

Figure 21:
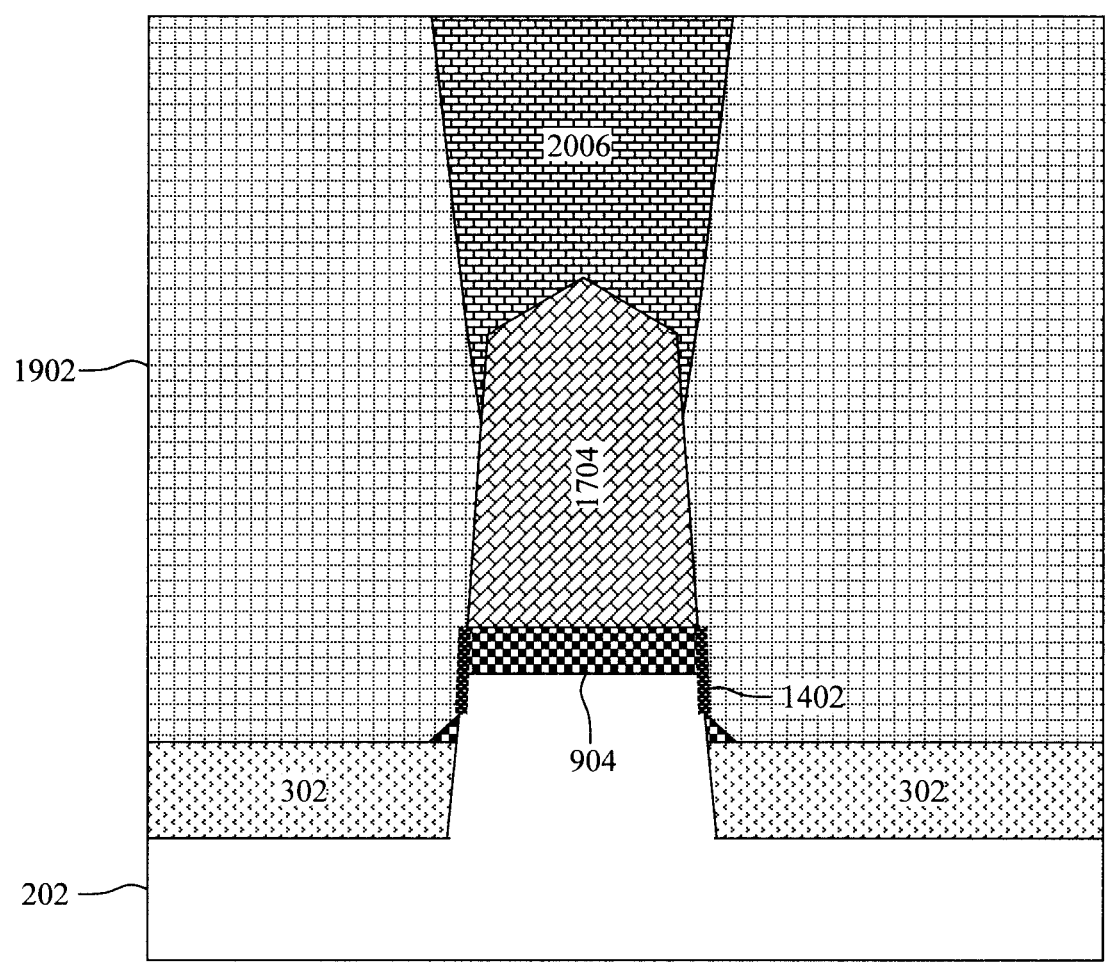
FIG. 21 is a cross-sectional diagram illustrating that the source and drain contacts from a cross-sectional view through the device stack between two of the gates in a source and drain region of the device according to an embodiment of the present invention.

A source and drain contact 2006 is illustrated from another perspective in FIG. 21 (a cross-sectional view Y). As shown in FIG. 21, the source and drains 1704 can have a faceted top surface, and the source and drain contact 2006 can be formed in direct contact with that faceted surface as well with the at least a portion of the sidewalls of the source and drains 1704.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor field-effect transistor (FET) device, comprising:
   at least one device stack disposed on a substrate, wherein the at least one device stack comprises active layers oriented vertically over a bottom dielectric isolation layer;
   shallow trench isolation (STI) regions embedded in the substrate at a base of the at least one device stack, wherein a top surface of the STI regions is recessed below a top surface of the substrate exposing sidewalls of the substrate under the bottom dielectric isolation region, wherein the sidewalls of the substrate comprise implanted ions;
   source and drains on opposite sides of the active layers; and
   gates surrounding a portion of each of the active layers, wherein the gates are offset from the source and drains by inner spacers.

2. The semiconductor FET device of claim 1, wherein the source and drains comprise an epitaxial material, and wherein the epitaxial material is absent along the sidewalls of the substrate under the bottom dielectric isolation region.

3. The semiconductor FET device of claim 1, wherein the at least one implanted ion is selected from the group consisting of: arsenic ions, oxygen ions, and combinations thereof.

4. The semiconductor FET device of claim 1, wherein the at least one device stack has tapered angle sidewalls.

5. The semiconductor FET device of claim 1, wherein the active layers comprise silicon.

6. The semiconductor FET device of claim 1, wherein the bottom dielectric isolation layer comprises a material selected from the group consisting of: silicon oxide, silicon nitride, and combinations thereof.

7. The semiconductor FET device of claim 1, wherein the gates comprise:
   a gate dielectric disposed on the active layers in a channel region of the semiconductor FET device; and
   at least one workfunction-setting metal disposed on the gate dielectric.

8. The semiconductor FET device of claim 7, wherein the gate dielectric comprises a high-κ material selected from the group consisting of: hafnium oxide, lanthanum oxide, and combinations thereof.

9. The semiconductor FET device of claim 7, wherein the at least one workfunction-setting metal is selected from the group consisting of: titanium nitride, tantalum nitride, titanium aluminide, titanium aluminum nitride, titanium aluminum carbide, tantalum aluminide, tantalum aluminum nitride, tantalum aluminum carbide, tungsten, and combinations thereof.

10. A semiconductor FET device, comprising:
    at least one device stack disposed on a substrate, wherein the at least one device stack has tapered angle sidewalls and comprises active layers oriented vertically over a bottom dielectric isolation layer;
    STI regions embedded in the substrate at a base of the at least one device stack, wherein a top surface of the STI regions is recessed below a top surface of the substrate exposing sidewalls of the substrate under the bottom dielectric isolation region, and wherein the sidewalls of the substrate comprise implanted ions selected from the group consisting of: arsenic ions, oxygen ions, nitride ions, and combinations thereof;
    source and drains on opposite sides of the active layers, wherein the source and drains comprise an epitaxial material, and wherein the epitaxial material is absent along the sidewalls of the substrate under the bottom dielectric isolation region; and
    gates surrounding a portion of each of the active layers, wherein the gates are offset from the source and drains by inner spacers.

11. The semiconductor FET device of claim 10, wherein the bottom dielectric isolation layer comprises a material selected from the group consisting of: silicon oxide, silicon nitride, and combinations thereof.

12. The semiconductor FET device of claim 10, wherein the gates comprise:
    a gate dielectric disposed on the active layers in a channel region of the semiconductor FET device; and
    at least one workfunction-setting metal disposed on the gate dielectric.

13. The semiconductor FET device of claim 12, wherein the gate dielectric comprises a high-κ material selected from the group consisting of: hafnium oxide, lanthanum oxide, and combinations thereof, and wherein the at least one workfunction-setting metal is selected from the group consisting of: titanium nitride, tantalum nitride, titanium aluminide, titanium aluminum nitride, titanium aluminum carbide, tantalum aluminide, tantalum aluminum nitride, tantalum aluminum carbide, tungsten, and combinations thereof.

* * * * *